US010055833B2

(12) United States Patent
Peters et al.

(10) Patent No.: US 10,055,833 B2
(45) Date of Patent: Aug. 21, 2018

(54) METHOD AND SYSTEM FOR EUV MASK BLANK BURIED DEFECT ANALYSIS

(71) Applicant: Carl Zeiss SMT GmbH, Oberkochen (DE)

(72) Inventors: Jan Hendrik Peters, Radebeul (DE); Frederik Blumrich, Jena (DE); Anthony Garetto, Jena (DE); Thomas Scherübl, Jena (DE); Renzo Capelli, Traunstein (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 84 days.

(21) Appl. No.: 14/952,073

(22) Filed: Nov. 25, 2015

(65) Prior Publication Data

US 2016/0169816 A1    Jun. 16, 2016

Related U.S. Application Data

(60) Provisional application No. 62/090,746, filed on Dec. 11, 2014.

(51) Int. Cl.
*G01N 23/203* (2006.01)
*G06T 7/00* (2017.01)
*G03F 1/84* (2012.01)

(52) U.S. Cl.
CPC ............. *G06T 7/0008* (2013.01); *G03F 1/84* (2013.01)

(58) Field of Classification Search
CPC .............. G01N 23/207; G01N 23/20; G01N 23/20025; G01N 2223/3306;
(Continued)

(56) References Cited

U.S. PATENT DOCUMENTS 6,864,490 B1 * 3/2005 Underwood ............. G01J 3/18
250/461.1
6,894,302 B2 * 5/2005 Ishimaru .............. G01N 21/474
250/559.41

(Continued)

OTHER PUBLICATIONS

Amano et al., "Propagation of surface topography of EUV blank substrate through multilayer and impact of phase defect structure on wafer image," Extreme Ultraviolet (EUV) Lithography IV, Ed. by Naulleau, Proc. of SPIE vol. 8679, 86791P, 2013. Seven pages.

(Continued)

*Primary Examiner* — Hoon Song
(74) *Attorney, Agent, or Firm* — HoustonHogle LLP (57) ABSTRACT

A reflective mask inspection system comprises a short wavelength radiation source for irradiating a reflective mask. A detector system detects the short wavelength radiation reflected from the reflective mask and a controller compares reflectance images of the reflective mask from the detector to characterize the mask. The system analyzes the spatially resolved reflectance characteristics of the substrate from different angles with respect to normal to the substrate and/or at different angles of rotation of the substrate. This information can be used to then analyze the mask for buried defects and then characterize those defects. This technique improves over current systems that rely on atomic force microscopes, which can only provide surface information.

24 Claims, 6 Drawing Sheets

(58) Field of Classification Search
CPC ..... G01N 2223/6116; G01N 23/20016; G01N 23/201; G01N 2223/0566; G01N 21/9501
See application file for complete search history.

(56) References Cited

U.S. PATENT DOCUMENTS

| | | | |
|---|---|---|---|
| 7,130,375 | B1 | 10/2006 | Yun et al. |
| 7,268,945 | B2 | 9/2007 | Yun et al. |
| 8,592,102 | B2 | 11/2013 | Lin et al. |
| 2008/0239290 | A1* | 10/2008 | Watanabe ............ G01N 21/956 356/73 |
| 2012/0127566 | A1 | 5/2012 | Mann et al. |
| 2013/0336573 | A1* | 12/2013 | Dalla-Torre ............ G06T 7/001 382/145 |
| 2016/0278196 | A1* | 9/2016 | Beijsens ................ H05G 2/008 |

OTHER PUBLICATIONS

Burns et al., "EUV mask defect mitigation through pattern placement," Photomask Technology 2010, Ed. by Montgomery, Proc. of SPIE vol. 7823, 782340, 2010. Five pages.

Negishi et al., "Using pattern shift to avoid blank defects during EUVL mask fabrication," Photomask and Next-Generation Lithography Mask Technology XX, Proc. SPIE 8701, 870112, Jun. 28, 2013. Ten pages.

Yan, Pei-Yang, "EUVL ML Mask Blank Fiducial Mark Application for ML Defect Mitigation," Photomask Technology 2009, Ed. by Zurbrick and Montgomery, Proc. of SPIE vol. 7488, 748819, 2009. Eight pages.

Yan et al., "EUVL Multilayer Mask Blank Defect Mitigation for Defect-free EUVL Mask Fabrication," Extreme Ultraviolet (EUV) Lithography III, Ed. by Naulleau and Wood II, Proc. of SPIE vol. 8322, 83220Z, 2012. Ten pages.

* cited by examiner

METHOD AND SYSTEM FOR EUV MASK BLANK BURIED DEFECT ANALYSIS

RELATED APPLICATIONS

This application claims the benefit under 35 U.S.C. 119(e) of U.S. Provisional Application No. 62/090,746, filed on Dec. 11, 2014, which is incorporated herein by reference in its entirety.

BACKGROUND OF THE INVENTION

The optics for lithography systems for the extended ultraviolet (EUV) into the x-ray regime (short wavelength radiation) are generally reflective. Even the lithography masks are reflective optics.

The short wavelength lithography masks include multilayer (ML) Bragg mirror stacks of many bilayers of high and low refractive index material. EUV masks, for example, usually have 40 bilayers of molybdenum and silicon, which have been successively coated onto a substrate. In general, a Bragg reflection of around 70% at 13.5 nanometer (nm) wavelength is targeted.

The short wavelength lithography masks have additional layers. On top of the ML mirror stack is a capping layer for environmental protection. In addition, this capping layer acts as an etch stop during mask fabrication. As a result, the capping layer should have a low EUV absorption. The stack is finalized by an optional buffer layer (e.g. SiO2). Finally, an anti-reflecting absorber layer (e.g. TaN) is patterned to define the dark and bright (reflective) features of the mask.

Because of the complex multilayer structure, these ML lithography masks are subject to defects known as multilayer (ML) defects (also called buried defects). These ML defects can come from the low thermal expansion material (LTEM) substrate in the form of pits, bumps or scratches that are created on the substrate surface from the chemical mechanical polish (CMP) and cleaning processes used to prepare the substrate prior to the deposition of the mirror stack. In fact, small substrate defects, e.g., below ~20 nm, are considered process inherent during CMP and cleaning ML defects can also arise during the ML deposition process. The complex multilayer, typically consisting of 80 or 100 alternating layers of Si and Mo, is deposited on this substrate followed by a Ru capping layer. Ion beam deposition (IBD) is normally used for the ML deposition steps and over half of all killer blank defects can be traced to this deposition step.

These ML defects are not easily detectable or capable of characterization by current inspection tools. Yet the defects present on the LTEM substrate or arising in the ML layers propagate through the ML mirror stack and will nevertheless print during EUV exposure if they affect reflective features of the final patterned photomask.

SUMMARY OF THE INVENTION

Currently ML defect characteristics are calculated by measuring the defects at the mask surface with an atomic force microscope (AFM) and then performing a simulation to calculate the shape of the defect and the required repair. This technique has significant limitations, however, due to the fact that the AFM can only provide surface information. No information regarding the bulk of the defect or its propagation through the ML stack can be discerned and is therefore not taken into account.

The present invention in contrast analyzes the spatially resolved reflectance characteristics of the substrate from different angles with respect to normal to the substrate and/or at different angles of rotation of the substrate. This information can be used to then analyze the mask for buried defects and then characterize those defects.

In general, according to one aspect, the invention features a reflective mask inspection system. It comprises a short wavelength radiation source for irradiating a reflective mask. A detector system detects the short wavelength radiation reflected from the reflective mask to generate reflectance images, and a controller compares the reflectance images of the reflective mask from the detector to characterize the mask.

In one embodiment, a rotation stage is provided to rotate the reflective mask relative to radiation from the radiation source between reflectance images captured by the detector system. In this way reflectance images at different rotation angles can be captured, compared, and used to characterize the mask.

In another embodiment, an angular positioning stage is provided for changing a tilt axis of the mask relative to radiation from the radiation source between reflectance images captured by the detector system. In this way reflectance images at different tilt angles can be captured and used to characterize the mask.

Preferably, the short wavelength radiation has a wavelength of less than 5 nanometers. This is less than half the operational wavelength of $\lambda=13.5$ nm that is common for EUV lithography systems. Typically, x-ray radiation is used, however.

Also, in the preferred configuration, the chief ray angle (CRA) between the radiation from the radiation source and the reflective mask is higher than an operational CRA of a multilayer mirror deposited on the reflective mask. In current EUV lithography systems the operational CRA is about 6°. In embodiments, the CRA is higher than 15 degrees.

In general, according to another aspect, the invention features a reflective mask inspection method. This method comprises irradiating a reflective mask with short wavelength radiation, detecting the short wavelength radiation reflected from the reflective mask to generate reflectance images, and comparing the reflectance images of the reflective mask to characterize the mask.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1A:
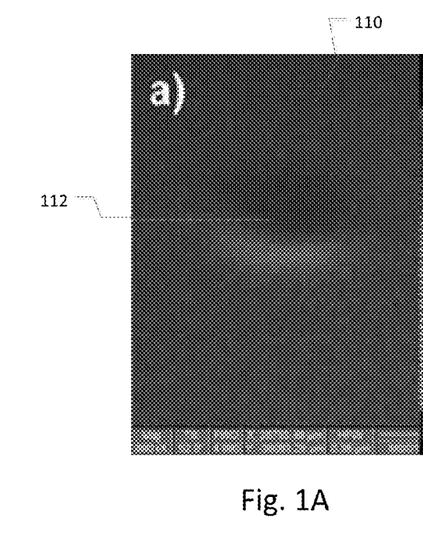
FIGS. 1A and 1B are a SEM image and a cross-sectional SEM image, respectively, of a pit defect in the substrate illustrating the surface information and the propagation of the defect through the ML.

FIG. 1A shows a pit surface defect 112 at the surface of the lithography mask blank 110. The surface defect 112 arose from a pit defect in the mask's substrate 116. The defect 112 presents as only a shallow depression at the mask's surface.

Figure 1B:
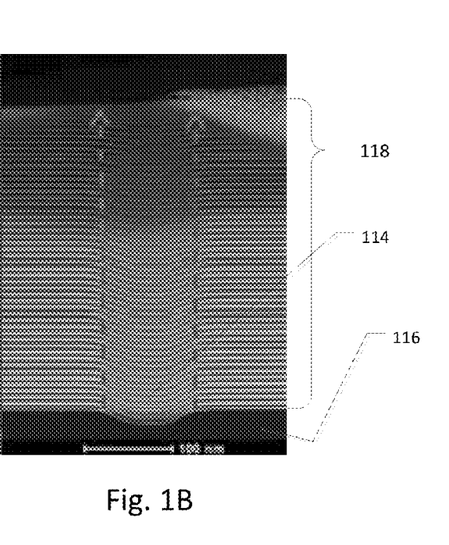

FIG. 1B shows the pit defect in cross-section. It arose from a pit 114 in the substrate 116. Then, as the successive layers of the ML 118 were deposited, the pattern of the substrate pit 114 propagated through the layers. In general, the cross-section of pit defects 112 measured at the surface are similar in size to the substrate pits 114 because the propagation through the ML remains relatively constant in width.

Figure 2A:
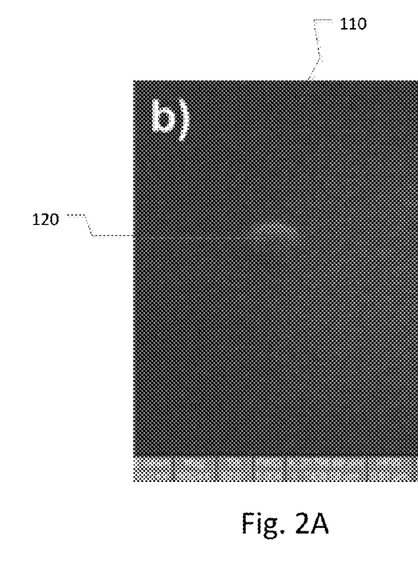
FIGS. 2A and 2B are a SEM image and a cross-sectional SEM image, respectively, of a bump defect in the substrate illustrating the surface information and the propagation of the defect through the ML.

FIG. 2A shows a bump surface defect 120 at the surface of the lithography mask blank 110. The surface defect 120 arose from a bump defect in the mask's substrate. The defect presents as only a small mesa.

Figure 2B:
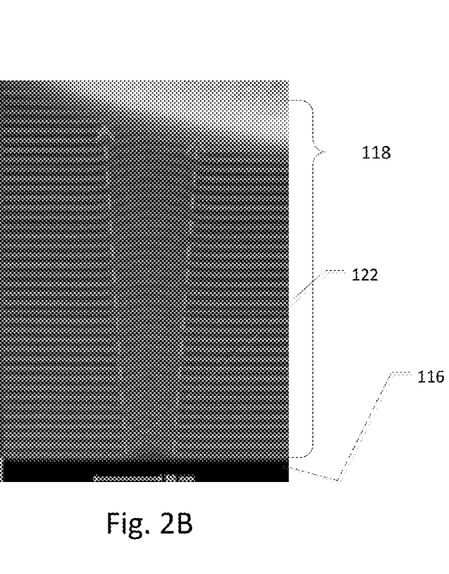

FIG. 2B shows the bump defect in cross-section. It arose from a bump 122 in the substrate 116. Then, as the successive layers of the ML 118 were deposited, the pattern of the substrate bump 122 propagated through the layers. In general, the cross-section of bump defects 120 measured at the surface are much larger than that at the substrate due to the nature of the propagation through the ML.

Figure 3:
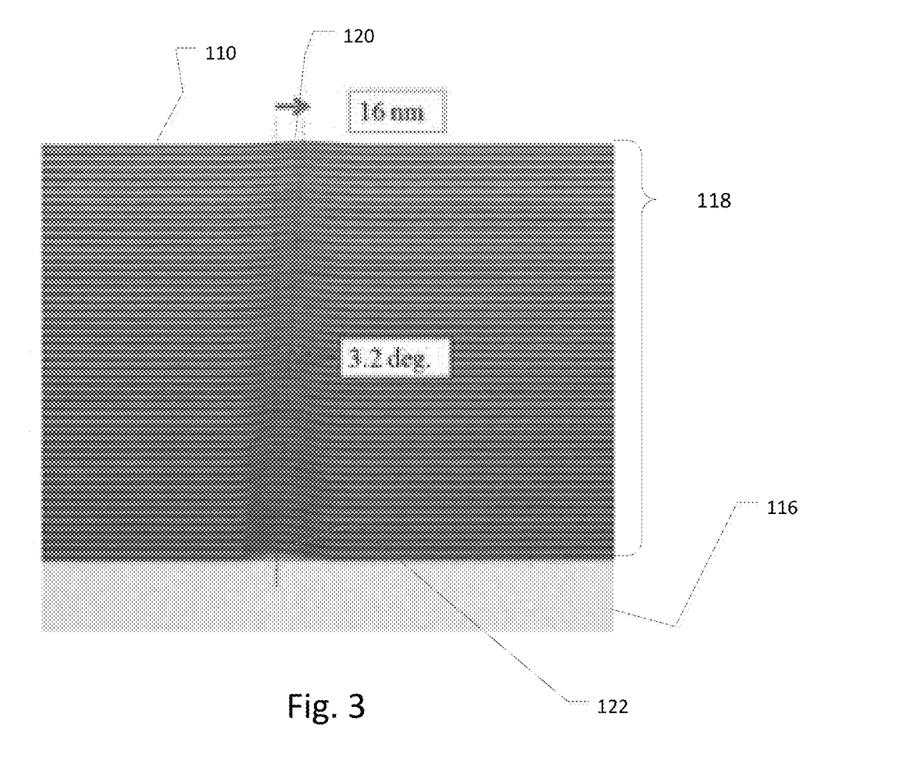
FIG. 3 is a cross-sectional SEM image of a bump defect in the substrate illustrating the surface information and the lateral translation of the defect through the successive layers of the ML.

FIG. 3 shows another bump defect 112 in cross-section illustrating lateral translation of the bump defect through the successive layers of the ML 118. The result of this lateral translation is that the surface measurement techniques often lead to biased defect position due to the assumption that the defect propagates in an entirely vertical (normal to substrate surface) direction.

Recent investigations of defect propagation through the ML 118 predict that the defects propagate at up to a 6° angle (Amano and Terasawa 2013, SPIE 86791P) with respect to the normal. As a result, there can be a significant shift of the surface defect 112, 120 with respect to the position of the substrate defect 114, 122. Whether the ML defect propagates vertically or at an angle can have an impact on the shape required for the compensational repair.

Additionally, a smoothing of substrate defects throughout the ML 118 is expected that might be a function of the multilayer deposition process parameters. But in general it will also be unknown to the user.

Figure 4:
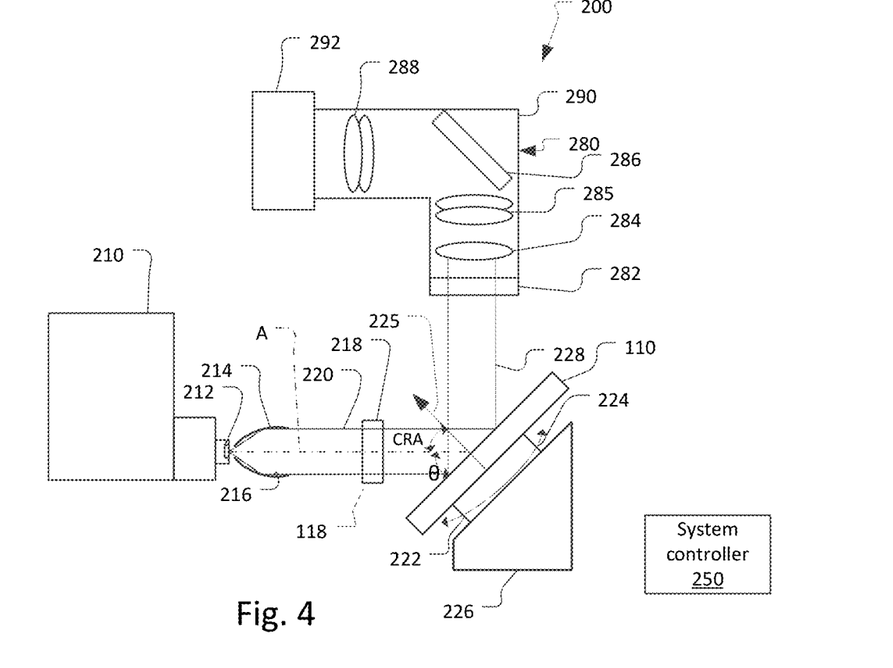
FIG. 4 is a schematic diagram of an EUV reflective mask blank inspection system according to an embodiment of the present invention.

FIG. 4 shows an EUV reflective mask blank inspection system 200 that has been constructed according to the principles of the present invention.

The system 200 generally includes the x-ray source 210 for illuminating the lithography mask blank 110.

In one implementation, a synchrotron source is used. Such sources can produce highly collimated, narrow wavelength radiation.

In another implementation, the source 210 is a "laboratory x-ray source". Examples include an x-ray tube, in which electrons are accelerated in a vacuum by an electric field and shot into a target piece of metal, with x-rays being emitted as the electrons decelerate in the metal. Typically, such sources produce a continuous spectrum of background (bremsstrahlung) x-rays combined with sharp peaks in intensity at certain energies that derive from the characteristic lines of the selected target, i.e., depending on the type of metal target used. Furthermore, the x-ray beams are divergent and lack spatial and temporal coherence. Preferably a transmission configuration is used in which the electron beam strikes the thin target 212 from its backside. The x-rays emitted from the other side of the target are used as the beam 220.

In another example, the source 210 is a metal jet x-ray source such as are available from Excillum AB, Kista, Sweden. This type of source uses microfocus tubes in which the anode is a liquid-metal jet. Thus, the anode is continuously regenerated and already molten. Other related examples include a rotating anode x-ray source or a microfocus x-ray source.

The x-ray beam 220 generated by source 210 is preferably conditioned to suppress unwanted energies or wavelengths of radiation. For example, undesired wavelengths present in the beam are eliminated or attenuated, using, for instance, an energy filter 218 (designed to select a desired x-ray wavelength range (bandwidth)). Typically, the energy filter, if used, is configured to select the energy associated with a single characteristic line of the target metal and suppress other wavelengths, including the bremsstrahlung radiation, when a laboratory x-ray source is used.

Since the laboratory sources produce a relatively weak and diverging radiation beam as compared to stronger sources, such as the synchrotrons, a condenser system 214 is preferably used to collimate the beam 220.

Different types of condensers can be used including fiber optic or zone plate devices. In one example, the condenser 214 is a capillary tube-based system. Specifically, the capillary tube condenser is preferably made out of a glass capillary tube that is circularly symmetric around the center optical axis A. This capillary tube has been formed, such as, by introducing a pressurized gas into the capillary tube, while heating it to soften the glass forming the tube. Preferably, the inner wall 216 is controlled to have an ellipsoidal or half-ellipsoidal curvature.

In one embodiment, the inner wall 216 of the capillary tube condenser is coated with a material that is reflective to the x-ray radiation beam 220. Typically, this is a high Z material, such as tungsten or gold. As a result, the radiation emitted by the source 210 is reflected due to the low angle of incidence on the inner surface 216 to enable the efficient relay of the radiation to the target mask blank 110.

The radiation is thus converted into a collimated beam of radiation 220, directed at the mask blank 110.

The mask blank 110 is preferably held on a rotation stage or goniometer 222, which allows for its controlled rotation (see arrow 224) about an axis 225 that is orthogonal to the surface of the mask blank 110. In a preferred embodiment, a positioning stage 226 is provided to position the goniometer 222 and thus the mask blank 110 in the two dimensional plane of the mask blank surface to thereby enable the step-wise scanning of the entire surface of the mask blank 110 while maintaining a constant angle between the mask normal axis 225 and optical axis A of the incoming radiation beam 220.

In one example, the positioning stage 226 is controlled by a system controller 250 to locate a region of interest of the surface of the mask blank 110 in the beam 220. Then, a first reflectance image of the mask blank 110 is acquired. Then the mask blank 110 is rotated by 180 degrees, for example, using rotation stage 222 and a second reflectance image is acquired of the same region of interest. In other examples, the mask blank is rotated to 90 and/or 270 degrees and additional reflectance image(s) are acquired.

The reflectance images are acquired when the x-ray beam 220 is reflected by the mask blank 110 and then detected by a detector system 280. In the illustrated example, the detector system 280 includes a scintillator 282 that converts the x-rays into photons of lower energy (typically within or near the visible range of the electromagnetic spectrum). This is required when the energy of the x-rays is such that they cannot be directly detected by a sensor chip.

An optical magnification system of the detector system 280 images the light from the scintillator 282 onto a camera 292, which typically includes a charge coupled device (CCD) or CMOS sensor chip. The spatially resolved image generated by the camera 292 is provided to the system controller 250.

In one example, the optical magnification system preferably includes a magnification lens system 284 held within a housing 290 of the detector system 280. A couplet 285 can be used to condition the optical signal from the magnification lens 284. A final lens couplet 288 forms the image on the detector or camera 292.

In general, suitable arrangements that can be used are described, for instance, in U.S. Pat. No. 7,130,375 B1, issued to Yun et al. on Oct. 13, 2006, the contents of which are incorporated herein by reference in their entirety.

In some examples, a turning mirror 286 is included in the optical portion of the detector system 280. It is located prior to the camera 292 to prevent damage from the x-rays.

In still other examples, flat panel detectors (direct or indirect) are used.

In operation, the controller 250 acquires reflectance images of the same region of the mask blank 110 but at different rotation angles of the mask blank 110 around axis 225.

Figure 5A:
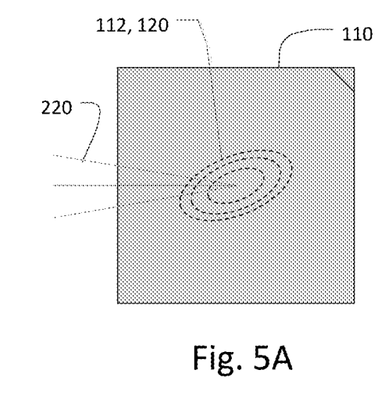
FIGS. 5A and 5B are top plan views showing the rotation of the mask blank 90 degrees between the capture of two reflectance images of an ML defect.

FIG. 5A shows the incoming radiation beam irradiating the ML defect 112, 120. This enables the capture a first reflectance image.

Figure 5B:
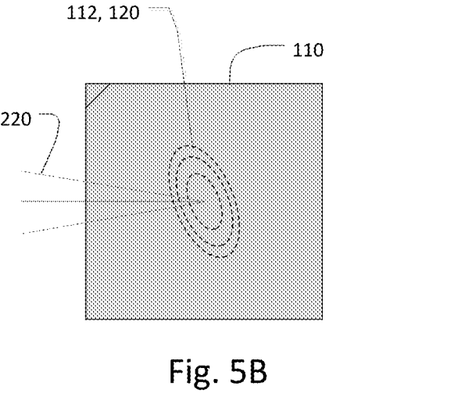

As shown in FIG. 5B, the mask blank 110 is then rotated by −90 degrees, for example, and the incoming radiation beam again irradiates the ML defect 112, 120. This enables the capture a second reflectance image.

Figure 6A:
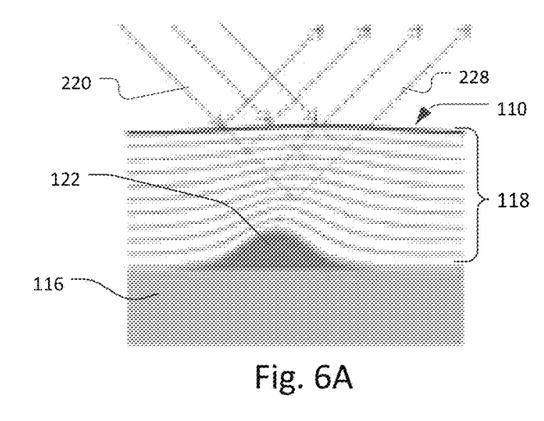
FIG. 6A is schematic cross-sectional view of a bump defect illustrating the reflection of the incoming beam by the multilayer mirror in a region around the defect when the substrate is positioned at 0°.

FIG. 6A shows the incoming beam 220 reflecting off the multilayer 118 of the mask blank 110 around the bump 122 on the substrate 116 when the mask blank 110 is rotated to a first angle such as 0°.

Figure 6B:
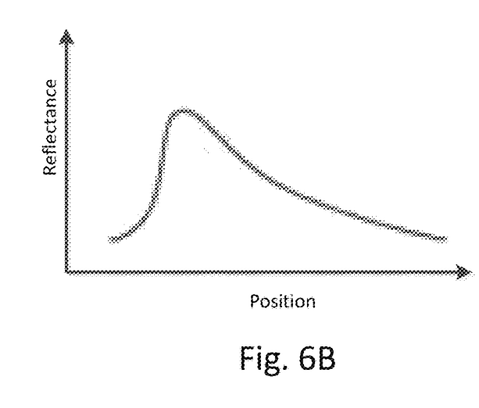
FIG. 6B is a schematic plot showing the change in reflectance of the substrate across the bump defect when the substrate is positioned at 0°, e.g., maximum reflectivity of undistorted ML minus actual reflectivity in presence of buried defect.

FIG. 6B illustrates the reflectance of the multilayer 118 as a function of position. As illustrated, the reflectance changes across the bump 122. The spatial reflectance changes as a function of a number of factors including the vertical distortion of the individual layers of the multilayer 118, any compression or expansion in the thickness of those layers, and the baseline reflectance of the layers surrounding the bump. The reflectance, e.g., maximum reflectivity of undistorted ML minus actual reflectivity in presence of buried defect, as a function of position along the mask blank 110 around the underlying bump peaks on one side of the bump and then drops off.

Figure 7A:
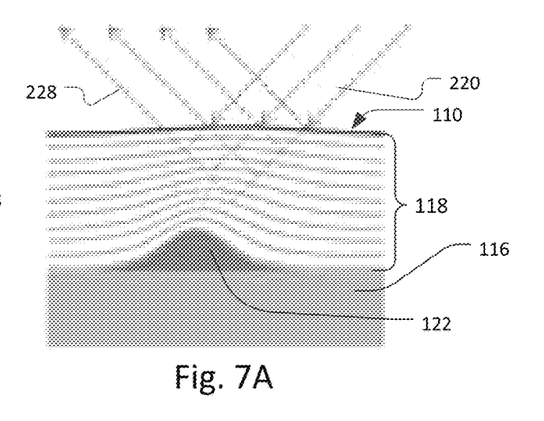
FIG. 7A is schematic cross-sectional view of the bump defect illustrating the reflection of the incoming beam by the multilayer mirror around the defect when the substrate is positioned at 180°.

FIG. 7A shows the reflectance of the multilayer when the angle of illumination has been changed such as by the rotation of the mask blank 110 by 180°.

Figure 7B:
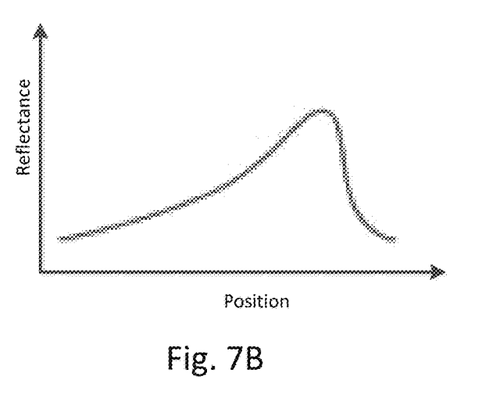
FIG. 7B is a schematic plot showing the change in reflectance of the substrate across the bump defect when the substrate is positioned at 180°.

As illustrated in FIG. 7B, the rotation of the mask blank 110 relative to the beam 220 changes the spatial location of the reflectance peak that arises due to the distortion precipitated by the bump defect 122.

As a result, the controller 250 by comparing the reflectance images taken from the different rotation angles of the mask blank can analyze the bump and/or pit defects, even when the bump/pit defects do not result in any surface changes, or only small surface changes, in the multilayer 118.

Figure 8A:
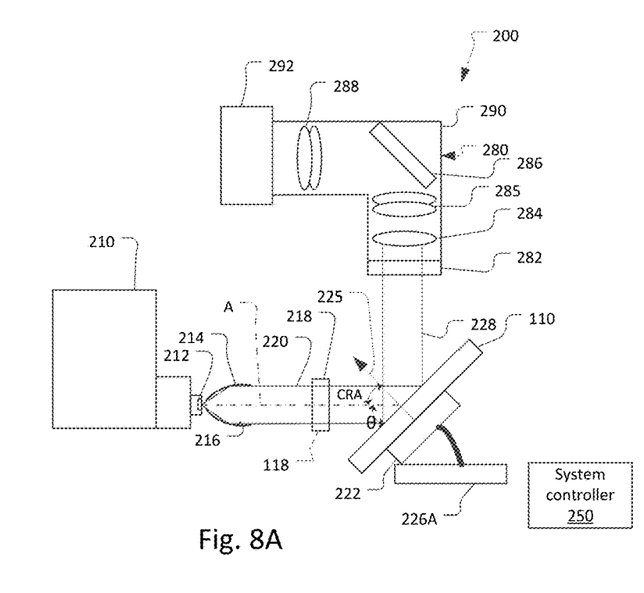
FIGS. 8A and 8B is a schematic diagram of an EUV reflective mask blank inspection system according to another embodiment of the present invention in which the chief ray angle (CRA) of the mask blank is changed between successive reflectance images.
Figure 8B:
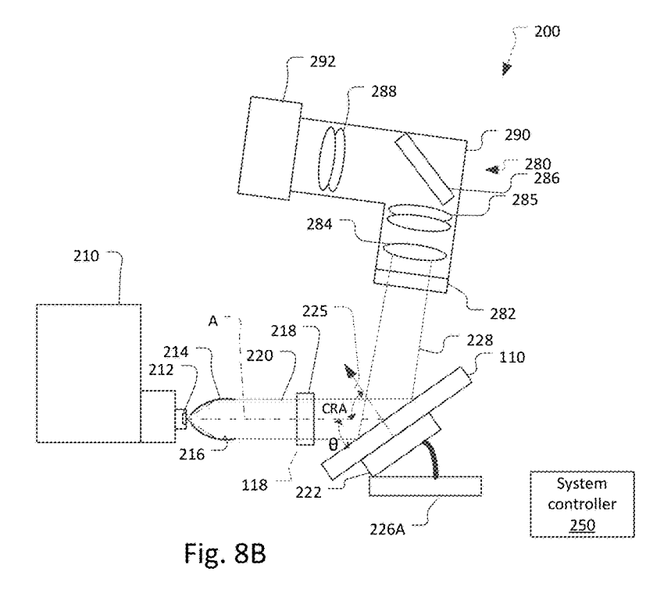

FIGS. 8A and 8B are schematic diagrams of an EUV reflective mask blank inspection system 200 according to another embodiment of the present invention. In this embodiment the chief ray angle (CRA) angle of the mask blank 110 is changed between successive reflectance images.

As in the previous embodiment, the system 200 generally includes the x-ray source 210 for illuminating the lithography mask blank 110, along with possibly an energy filter 218 and a condenser system 214, if required.

In this embodiment, the mask blank 110 is held an angular positioning stage 226A which is able to adjust the CRA angle between the mask normal axis 225 and optical axis A of the incoming radiation beam 220. This functionality is illustrated between FIGS. 8A and 8B in which after a first reflectance image is captured with at a first CRA angle, the angular positioning stage 226A changes the tilt axis of the mask blank 110 relative to the beam 220 to increase the CRA angle, in the illustrated example.

Figure 9A:
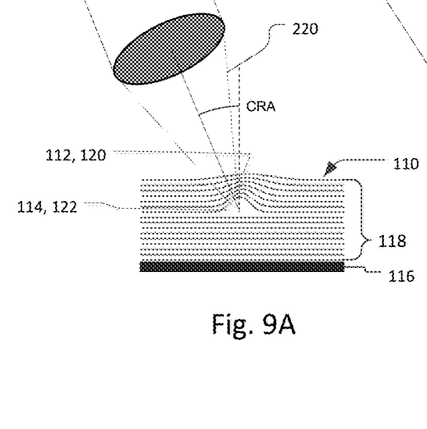
FIGS. 9A and 9B are schematic cross-sectional views in which the CRA angle of the mask blank is changed between successive reflectance images using the inspection system shown in FIGS. 8A and 8B.
Figure 9B:
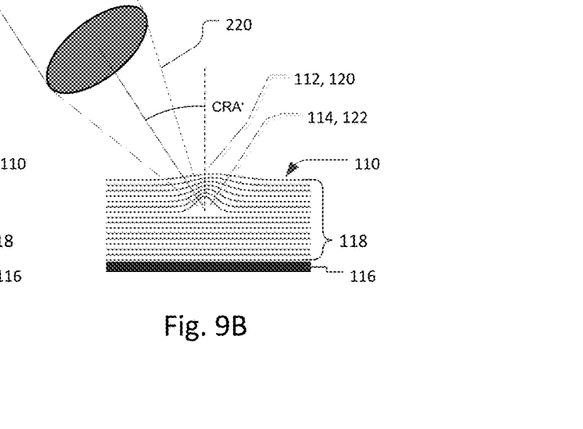

In the example, the angular positioning stage 226A is controlled by the system controller 250 to locate a region of interest of the surface of the mask blank 110 in the beam 220 by moving the mask blank in the plane of its surface. Then, a first reflectance image of the mask blank 110 is acquired with the orientation shown in FIG. 9A. Then the mask blank 110 is tilted to a new angle and a second reflectance image is acquired of the same region of interest as shown in FIG. 9B.

Returning to FIGS. 8A and 8B, the reflectance images are acquired when the x-ray beam 220 is reflected by the mask blank 110 and then detected by the detector system 280. In the illustrated example, the detector system 280 position will also be changed between the capture of the two reflectance images due to the beam displacement arising from the change in the CRA angle.

In operation, the controller 250 acquires reflectance images of the same region of the mask blank 110 but at different CRA angles of the mask blank 110 to the normal axis 225.

Figure 10A:
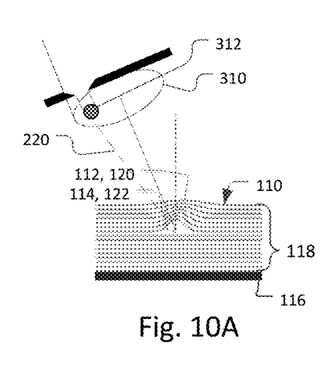
FIGS. 10A, 10B, and 10C are schematic cross-sectional views in which the CRA angle of the mask blank is changed between successive reflectance images using an aperture system.
Figure 10B:
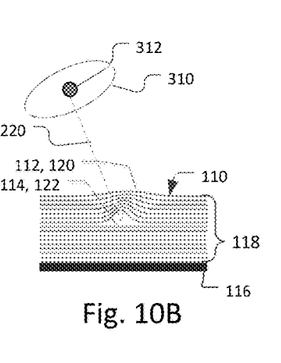
Figure 10C:
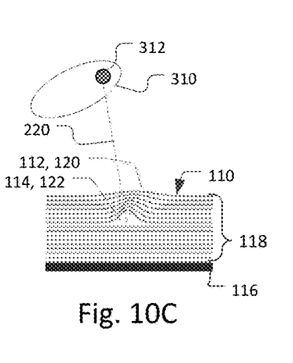

FIGS. 10A, 10B, and 10C illustrate the operation of an alternative embodiment in which the CRA angle is also changed between successive reflectance images.

Here, the CRA angle is changed by configuring the beam from the source 210 to be converging but then illuminating the mask blank 110 through an adjustable aperture 312.

In more detail, as illustrated in FIG. 10 A, a first reflectance image is captured with the aperture 312 of the aperture plate 310 in a leftmost position. As result, the converging beam that passes through the aperture 312 forms a first, high CRA angle with respect to the substrate 110. Then, the aperture plate 310 is adjusted to move the aperture 312 to an intermediate position, as shown in FIG. 10B. As result, the beam 220 that strikes the substrate 110 now has a reduced CRA angle. Finally, as illustrated in FIG. 10C, by further adjusting the aperture plate 310, the aperture 312 is moved to still a third position, with a further reduced CRA angle. In this way, three different reflectance images of the substrate 110 and any ML defect 112, 120 can be acquired at different CRA angles.

A number of different approaches can be used to process the reflectance images of the ML defects 112, 120 at different rotation angles of the mask blank 110 around axis 225 or different CRA angles. In one example, stereo-photogrammetry algorithms (triangulation) are utilized by the controller 250 using the parallax displacement which occurs by viewing a defect along two different lines of sight. Other examples provide analysis along more than two projection directions and potentially also the through-focus behaviour of the buried defect. Additionally, reconstruction algorithms for computed tomography, such as Algebraic Reconstruction Technique ART and/or Filtered Back Projection are used location and characterize the ML defects.

As discussed above, in one example, ML defects are analyzed based on spatial changes in the reflectance of the ML 118 around the defects. Depending on the parameters of the multilayer, angle of illumination or chief ray angle (CRA), wavelength of the beam 220, and the distortion of the multilayer ML by the defects, the defects will present as localized increase and/or decreases in reflectance. As a result, the selected wavelength of the beam 220 and the angle (CRA) of the beam 220 to the mask blank 110 must be selected to achieve constructive Bragg reflection:

$$n\lambda = 2d \sin \theta,$$

where d bilayer thickness (EUV mask: d≈4.1(Si)+2.8(Mo)=6.9 nm)

θ angle between the incident ray and the object.

The ML stacks of the masks are designed for EUV imaging (i.e. AIMS EUV). In a typically configuration, the operational chief ray angle (CRA)~6°. CRA=90°−θ Further, the operational wavelength ML is λ=13.5 nm.

In embodiments of the present invention, these same parameters could be used to analyze buried defects. A drawback, however is that the λ=13.5 nm wavelength requires a vacuum.

In the preferred embodiments, a higher CRA angle or range of CRA angles is used, i.e., CRA>6°. In one implementation, CRA is higher than 15 degrees and is preferably between 30-45°. Further, short wavelength radiation is used for the illumination beam 220. This short wavelength radiation has a wavelength of about 5 nm or shorter and is preferably shorter than 1 nm (soft x-rays).

For the given EUV mask blank geometry λ is a function of CRA is:

$$\lambda = 2\frac{d}{n}\cos CRA$$

Applying standard multilayer geometries used in EUV lithography, a number of possible wavelengths could be used as the illumination beam 220. In one example, target 212 of the x-ray source 210 is aluminum and the Kα characteristic line of the emission is selected. In another example, the target 212 is chromium (Cr) and its Kα is again used. Finally, still another example is a copper target 212. The different target options, the corresponding wavelengths, and the CRA angle for reflectivity are presented below:

TABLE 1

| λ | keV | n | CRA |
|---|---|---|---|
| 0.84 nm | 1.49 (Al Kα) | 12 | 43.4° |
| 0.23 nm | 5.41 (Cr Kα) | 43 | 44.4° |
| 0.15 nm | 8.05 (Cu Kα) | 77 | 30.7° |

Each of these wavelengths and CRA angles will result is reflection of the incoming beam 220 by the multilayer 118.

While this invention has been particularly shown and described with references to preferred embodiments thereof, it will be understood by those skilled in the art that various changes in form and details may be made therein without departing from the scope of the invention encompassed by the appended claims.

What is claimed is:

1. A reflective mask inspection system, comprising:
   a short wavelength radiation source for irradiating a reflective mask;
   a detector system for detecting the short wavelength radiation reflected from the reflective mask and generating different reflectance images from a same region of the reflective mask by changing an aperture position to define different angles for an illumination beam of the short wavelength radiation; and
   a controller that compares the different reflectance images of the reflective mask from the detector to characterize the mask.

2. A system as claimed in claim 1, further comprising a rotation stage for rotating the reflective mask relative to radiation from the radiation source between reflectance images captured by the detector system.

3. A system as claimed in claim 1, further comprising an angular positioning stage for changing a tilt axis of the mask relative to radiation from the radiation source between reflectance images captured by the detector system.

4. A system as claimed in claim 1, wherein the short wavelength radiation has a wavelength of less than 5 nanometers.

5. A system as claimed in claim 1, wherein the short wavelength radiation is x-ray radiation.

6. A system as claimed in claim 1, wherein short wavelength radiation is shorter than an operational wavelength of a multilayer mirror of the reflective mask.

7. A system as claimed in claim 1, wherein a chief ray angle (CRA) between the radiation from the radiation source and the reflective mask is higher than an operational CRA of a multilayer mirror of the reflective mask.

8. A system as claimed in claim 1, wherein a chief ray angle (CRA) between the radiation from the radiation source and the reflective mask is higher than 15 degrees.

9. A reflective mask inspection method, comprising:
irradiating a reflective mask with short wavelength radiation;
detecting the short wavelength radiation reflected from the reflective mask and generating different reflectance images from a same region of the reflective mask by positioning an aperture in different positions to define different angles between an illumination beam of the short wavelength radiation and the reflective mask; and
comparing the different reflectance images of the reflective mask to characterize the mask.

10. A method as claimed in claim 9, further comprising rotating the reflective mask relative to the radiation to capture reflectance images at different rotation angles.

11. A method as claimed in claim 9, further comprising changing a tilt axis of the mask relative to the radiation to capture reflectance images at different CRA angles.

12. A method as claimed in claim 9, wherein the short wavelength radiation has a wavelength of less than 5 nanometers.

13. A method as claimed in claim 9, wherein the short wavelength radiation is x-ray radiation.

14. A method as claimed in claim 9, wherein short wavelength radiation is shorter than an operational wavelength of a multilayer mirror of the reflective mask.

15. A method as claimed in claim 9, wherein a chief ray angle (CRA) between the radiation from the radiation source and the reflective mask is higher than an operational CRA of a multilayer mirror of the reflective mask.

16. A method as claimed in claim 9, wherein a chief ray angle (CRA) between the radiation from the radiation source and the reflective mask is higher than 15 degrees.

17. The method as claimed in claim 9, wherein the different reflectance images are generated by changing at least one of: a rotation angle of the reflective mask about an axis orthogonal to a surface of the reflective mask, and an angle between the reflective mask and an illumination beam of the short wavelength radiation.

18. The method as claimed in claim 17, wherein the angle between the reflective mask and the illumination beam is changed by changing a tilt axis of the reflective mask relative to the illumination beam.

19. The method as claimed in claim 9, wherein the illumination beam is a converging beam.

20. The method as claimed in claim 9, further comprising:
analyzing spatially resolved reflectance characteristics of the reflective mask to characterize buried defects of the reflective mask.

21. The system as claimed in claim 1, further configured for generating the different reflectance images by changing at least one of: a rotation angle of the reflective mask about an axis orthogonal to a surface of the reflective mask, and an angle between the reflective mask and an illumination beam from the radiation source.

22. The system as claimed in claim 21, further comprising an angular positioning stage for changing a tilt axis of the reflective mask relative to the illumination beam.

23. The system as claimed in claim 1,
wherein the aperture is configured to be movable to different positions to define different angles between an illumination beam from the radiation source and the reflective mask for generating the different reflectance images; and wherein the illumination beam is a converging beam.

24. The system as claimed in claim 1, wherein the controller is configured for analyzing spatially resolved reflectance characteristics of the reflective mask to characterize buried defects of the reflective mask.

* * * * *